(12) United States Patent
Osgood (10) Patent No.: US 8,514,576 B1
(45) Date of Patent: Aug. 20, 2013

(54) DUAL SIDED SYSTEM IN A PACKAGE

(75) Inventor: Howard Baxter Osgood, Livermore, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 233 days.

(21) Appl. No.: 13/160,202

(22) Filed: Jun. 14, 2011

(51) Int. Cl.
 *H05K 7/20* (2006.01)

(52) U.S. Cl.
 USPC ........... 361/719; 361/704; 361/705; 361/715; 257/678; 257/686; 257/787; 257/718; 29/832; 29/836

(58) Field of Classification Search
 USPC ............... 361/679.46, 679.54, 704–712, 715, 361/719–724, 732, 736, 748, 752, 760–767, 361/784, 792, 794; 165/80.3, 104.33, 185; 174/15.1, 16.3, 252, 255, 257; 257/686, 257/698, 691, 680, 706–727; 29/825–852, 29/890.03; 438/106–118, 14, 464
 See application file for complete search history.

(56) References Cited

U.S. PATENT DOCUMENTS

| | | | | |
|---|---|---|---|---|
| 4,771,365 A * | 9/1988 | Cichocki et al. | ............. | 361/705 |
| 4,774,632 A * | 9/1988 | Neugebauer | .................. | 361/715 |
| 5,396,403 A * | 3/1995 | Patel | ............................ | 361/705 |
| 5,801,072 A * | 9/1998 | Barber | .......................... | 438/107 |
| 6,285,559 B1 * | 9/2001 | Fukiharu | ....................... | 361/760 |
| 6,435,883 B1 * | 8/2002 | Warren | ........................... | 439/71 |
| 6,489,687 B1 * | 12/2002 | Hashimoto | .................... | 257/777 |
| 6,680,212 B2 * | 1/2004 | Degani et al. | .................... | 438/14 |
| 6,717,248 B2 * | 4/2004 | Shin et al. | ...................... | 257/678 |
| 6,724,631 B2 * | 4/2004 | Ye et al. | ......................... | 361/719 |
| 6,833,628 B2 * | 12/2004 | Brandenburg et al. | ........ | 257/778 |
| 7,170,158 B2 * | 1/2007 | Choi et al. | ..................... | 257/686 |
| 7,224,046 B2 * | 5/2007 | Abe et al. | ....................... | 257/668 |
| 7,268,425 B2 * | 9/2007 | Mallik et al. | ................... | 257/706 |
| 7,298,038 B2 * | 11/2007 | Filoteo et al. | ................. | 257/686 |
| 7,459,797 B2 * | 12/2008 | James et al. | ................... | 257/787 |
| 7,646,093 B2 * | 1/2010 | Braunisch et al. | ............ | 257/718 |
| 7,724,530 B2 * | 5/2010 | Clayton et al. | ................ | 361/749 |
| 7,985,663 B2 * | 7/2011 | Sato et al. | ...................... | 438/464 |
| 8,008,121 B2 * | 8/2011 | Choi et al. | ..................... | 438/107 |
| 8,279,605 B2 * | 10/2012 | Kawanami et al. | ........... | 361/704 |
| 2003/0015782 A1 * | 1/2003 | Choi et al. | ..................... | 257/686 |
| 2003/0096288 A1 * | 5/2003 | Ni et al. | .............................. | 435/6 |
| 2008/0157322 A1 * | 7/2008 | Tang et al. | ..................... | 257/686 |
| 2008/0272483 A1 * | 11/2008 | Oman | ........................... | 257/713 |
| 2010/0140772 A1 | 6/2010 | Lin et al. | | |
| 2011/0024888 A1 | 2/2011 | Pagaila et al. | | |
| 2011/0031634 A1 | 2/2011 | Pagaila | | |
| 2011/0042798 A1 | 2/2011 | Pagaila et al. | | |
| 2011/0045634 A1 | 2/2011 | Pagaila | | |
| 2011/0057713 A1 * | 3/2011 | Kawanami et al. | ........... | 327/427 |

\* cited by examiner

*Primary Examiner* — Michail V Datskovskiy

(74) *Attorney, Agent, or Firm* — Harrity & Harrity, LLP

(57) ABSTRACT

A device includes a circuit board and a dual sided package. The dual sided package fits into an opening provided in the circuit board. The dual sided package includes a first portion with a first set of integrated circuits (ICs), a second portion with a second set of ICs, and a package substrate provided between the first portion and the second portion. The package substrate connects to the circuit board, and the first portion and the second portion face opposite directions.

20 Claims, 6 Drawing Sheets

DUAL SIDED SYSTEM IN A PACKAGE

BACKGROUND

Components of a printed circuit board (PCB) of a networking device (e.g., a switch, a router, etc.) require high signal speeds. A conventional PCB also requires a large amount of space between components (e.g., integrated circuits (ICs)). The high signal speeds and the large amount of space put high power demands, on the PCB, that create unwanted heat. The heat, along with loss and impedance caused by the large amount of space, in turn limits signal speed in the PCB. A System in Package (SiP) (or a Multi-chip Module) combines multiple ICs into a package (or module). The SiP may be added, as a single component, on top of one side of a PCB. The PCB may include multiple SiPs. While a SiP permits closer spacing of ICs within a package, a heat per unit area increases when the ICs are closer together. Furthermore, limitations exist as to how many ICs may fit into a SiP and the large amount of space is still required between SiPs with different ICs. As a result, significant limitations of signal speeds in PCBs continue to exist.

SUMMARY

According to one aspect, a dual sided package may include: a first portion that includes a first set of integrated circuits (ICs); a second portion that includes a second set of ICs; and a package substrate provided between the first portion and the second portion. The first set of ICs may include one or more ICs that face a first direction. The second set of ICs may include one or more ICs that face a second direction. The second direction may be an opposite direction of the first direction.

According to another aspect, a device may include a circuit board that includes an opening and a dual sided package provided in the opening. The dual sided package may include a first portion with a first set of integrated circuits (ICs), a second portion with a second set of ICs, and a package substrate provided between the first portion and the second portion. The package substrate may connect to the circuit board, and the first portion and the second portion may face opposite directions.

According to yet another aspect, a method may include: providing a package substrate for a dual sided package; connecting a first set of integrated circuits (ICs) on a first side of the package substrate; and connecting a second set of ICs on a second side of the package substrate. The first set of ICs may include one or more ICs that face a first direction. The second set of ICs may include one or more ICs that face a second direction. The second direction may be an opposite direction of the first direction.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

A package may refer to one or more (e.g., two) integrated circuits (ICs) that are grouped together into a single component. A System in a Package (SiP) is one example of a package. The description below refers to a SiP. However, the description may also apply to any other type of package, such as a Multi-chip Module.

An implementation, described herein, may include a dual sided System in a Package (SiP). The dual sided SiP may include a first side (or portion), a second side (or portion), and a package substrate provided between the first portion and the second portion. The first side (e.g., a top of the package substrate) may include a heat sink, a lid, one or more integrated circuits (ICs) (and/or other types of components), and a space transformer provided between the ICs and the package substrate. The second side (e.g., a bottom of the package substrate) may include the same type of components as the first side. The first side and the second side may face opposite directions. The implementation may also include a printed circuit board (PCB) specifically designed for one or more dual sided SiPs. The PCB may include a hole or an opening for receiving the dual sided SiP. The dual sided SiP may be provided in the opening, and may be fixedly attach to the PCB. In one example, the package substrate may be fixedly attached to the PCB.

Figure 1:
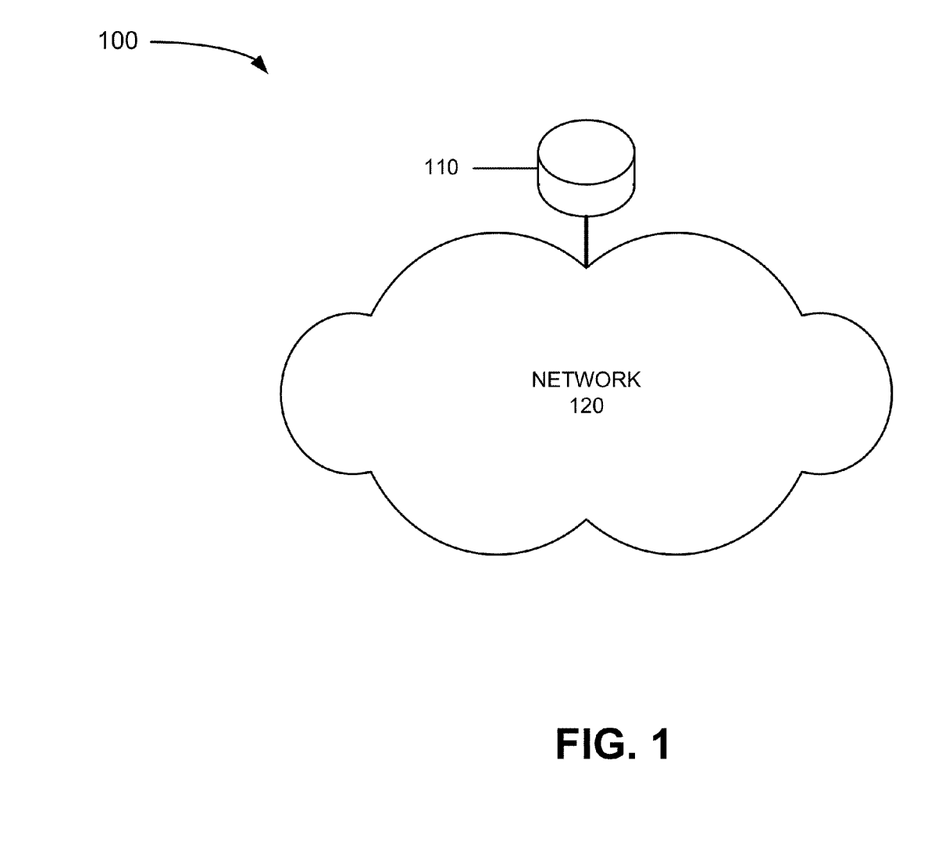
FIG. 1 is a diagram of an example environment in which systems and/or methods described herein may be implemented.

FIG. 1 is a diagram of an example environment 100 in which systems and/or methods described herein may be implemented. Environment 100 may include a device 110 and a network 120. Device 110 may include a networking device for performing network-related functions, such as a router, a server, or a switch. Alternatively, device 110 may include a computing device (e.g., a laptop computer, a desktop computer, a workstation, a notebook computer, a tablet computer, etc.); a communication device (e.g., a smart phone, a personal digital assistant (PDA), a wireless telephone, etc.); etc. that communicates via network 120.

Network 120 may include the Internet, an ad hoc network, a local area network (LAN), a wide area network (WAN), a metropolitan area network (MAN), a cellular network, a public switched telephone network (PSTN), any other network, or a combination of networks. Device 110 may communicate with other devices (not shown) and may communicate through wired and/or wireless communication links via network 120.

Figure 2:
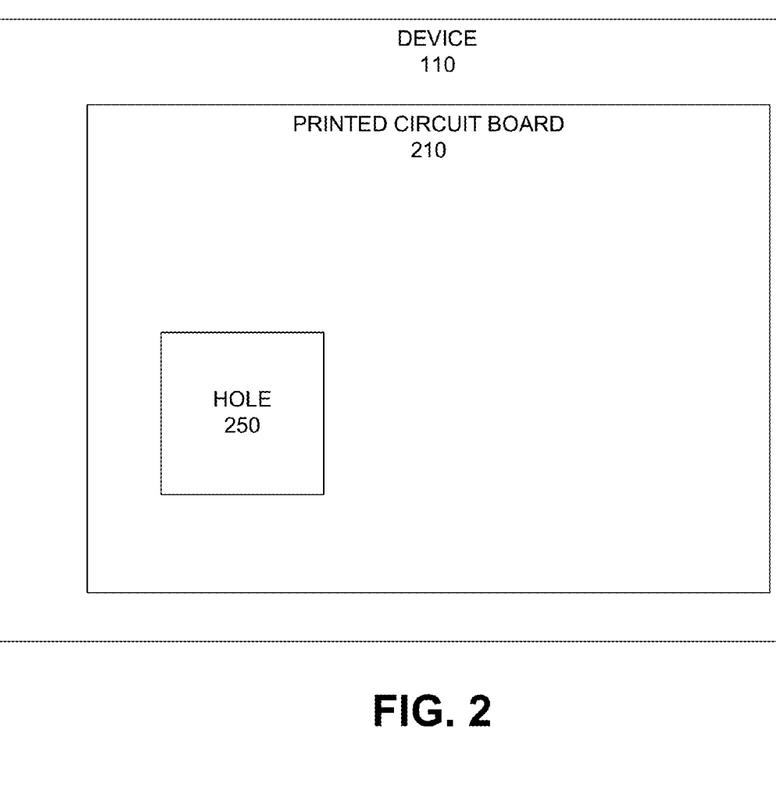
FIG. 2 is a diagram of an example device of FIG. 1.

FIG. 2 is a diagram of example components of device 110. As shown, device 110 may include, for example, a PCB 210 and/or one or more other printed circuit boards (PCBs) (not shown in FIG. 2). PCB 210 may connect multiple electronic components (e.g., SiPs) via conductive paths through which signals and power may be transmitted. A manufacturer of PCB 210 may create a hole or opening 250 and/or one or more other holes (not shown in FIG. 2). Hole 250 may be sized and/or shaped to receive and retain a dual sided SiP. The manufacturer may place a dual sided SiP, described further below, into hole 250 and may attach the dual sided SiP to PCB 210.

Although FIG. 2 shows example components of device 110, in other implementations, device 110 may include fewer components, different components, differently arranged components, or additional components than depicted in FIG. 2. Alternatively, or additionally, one or more components of device 110 may perform one or more other tasks described as being performed by one or more other components of device 110. For example, although FIG. 2 shows what is termed a "printed circuit board," in one example implementation, PCB 210 may be replaced with any electronics-based substrate, such as, for example, rigid-flex circuits, semiconductor packages, multichip carrier modules (MCMs), micro electro mechanical systems (MEMS), ceramic circuits, midplanes, backplanes, and/or other types of substrates.

Figure 3:
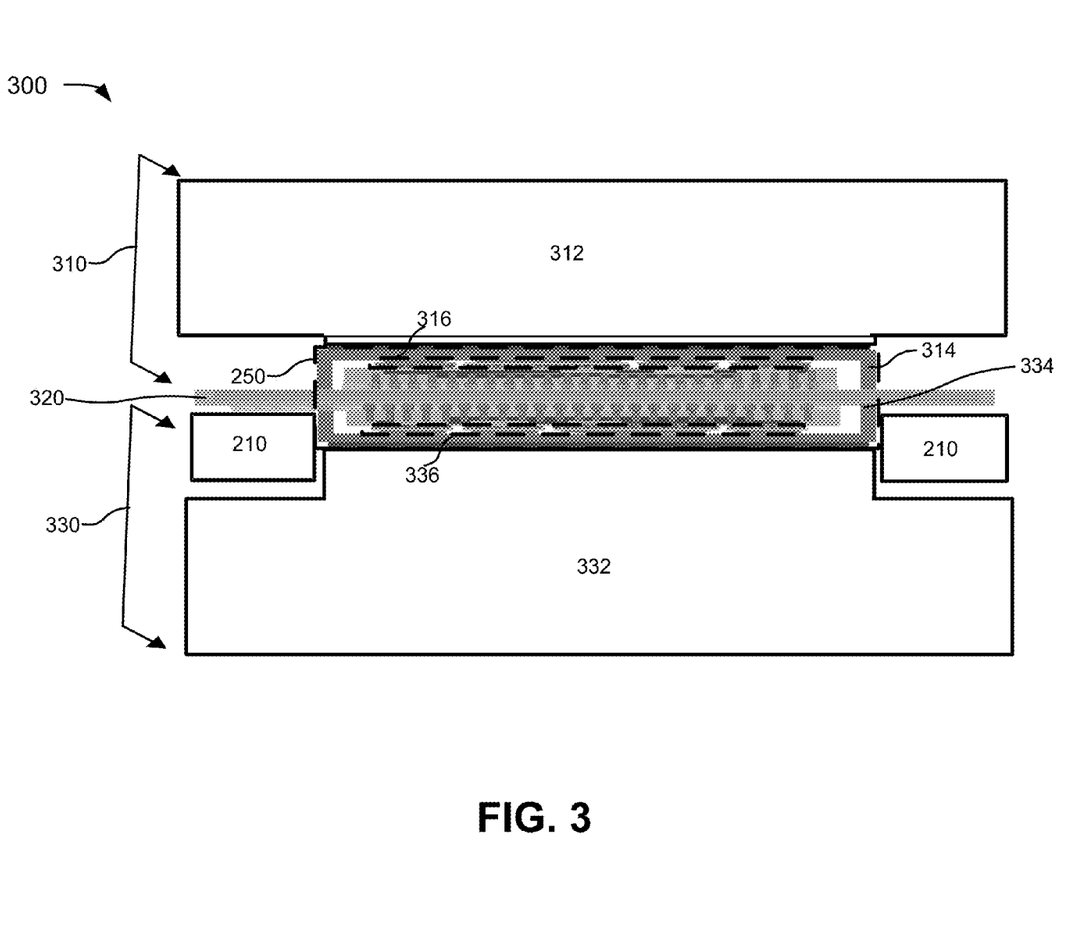
FIG. 3 is a diagram of an example dual sided System in a Package (SiP)

FIG. 3 is a diagram of an example dual sided SiP 300. FIG. 3 illustrates a side view of dual sided SiP 300, as provided in hole 250 of PCB 210. As shown, dual sided SiP 300 may include a first side or portion 310, a package substrate 320, and a second side or portion 330. In practice, dual sided SiP 300 may include more components, fewer components, different components, and/or differently arranged components than are shown in FIG. 3. PCB 210 may connect dual sided SiP 300 to device 110.

First portion 310 may include a heat sink 312, a lid 314, a first set of ICs 316, and/or one or more other components that are inside lid 314. Second portion 330 may include a heat sink 332, a lid 334, a second set of ICs 336, and/or one or more other components that are inside lid 334. In practice, first portion 310 and/or second portion 330 may include more components, fewer components, different components, and/or differently arranged components than depicted in FIG. 3.

First portion 310 may connect to one side of package substrate 320. Second portion 330 may connect to the other side of package substrate 320. Package substrate 320 may facilitate transmission of signals between components of first portion 310 and components of second portion 330. Package substrate 320 may extend out of hole 250 onto PCB 210 and may enable dual sided SiP 300 to connect with PCB 210. Package substrate 320 may facilitate transmission of signals between dual sided SiP 300 and one or more other components (e.g., a different dual sided SiP) of PCB 210.

Package substrate 320 may include a ceramic material, a fiberglass material, and/or one or more other types of materials (e.g., epoxy). In some implementations, package substrate 320 may include an organic core ball grid array (BGA) substrate, which may be fiberglass-based. In one example, a coefficient of thermal expansion (CTE) (e.g., in parts per million (ppm)/° C.) of package substrate 320 may match a CTE of PCB 210 on an xy plane. In another example, the CTE of package substrate 320 may match the CTE of PCB 210 when a value of the CTE of package substrate 320 is approximately equal to a value of the CTE of PCB 210.

Heat sink 312 and/or heat sink 332 may include a fan and/or one or more other components that radiate heat away from dual sided SiP 300 via convection and/or radiative cooling. For example, heat sink 312 and/or heat sink 332 may include metal fins that dissipate heat away from SiP 300 (e.g., from first portion 310 and/or second portion 330, respectively) to an environment outside of PCB 210. In another example, heat sink 312 and/or heat sink 332 may include one or more fans that blow air across first portion 310 and/or second portion 330, respectively. Heat sink 312 and heat sink 332, of dual sided SiP 300, together may provide greater heat dissipation than a single heat sink.

Lid 314 and/or lid 334 may include one or more other components that provide additional cooling for first portion 310 and/or second portion 330, respectively, in addition to the cooling provided by heat sink 312 and/or heat sink 332. Lid 314 and/or lid 334 may include a particular metal and/or any other type of material that acts as a thermal conductor. For example, lid 314 and/or lid 334 may include a copper heat spreader. Lid 314 and/or lid 334 may also provide protective covering for components provided in first portion 310 and/or second portion 330, respectively.

First set of ICs 316 may be located inside lid 314 and second set of ICs 335 may be located inside lid 334. First set of ICs 316 may face a first direction and second set of ICs 336 may face a second direction that is opposite the first direction. Further examples of possible components that may be provided inside lid 314 and/or lid 334 are described below with reference to FIG. 4. In one implementation, the one or more components that may be provided inside lid 334 may include the same types of components as the one or more components that may be provided inside lid 314. In another implementation, the one or more components that may be provided inside lid 334 may include different types of components than the one or more components that may be provided inside lid 314.

Dual sided SiP 300 may enable more components (e.g., ICs) to be provided in a package than a single sided SiP because components may be placed on both sides (e.g., first portion 310 and second portion 330) of dual sided SiP 300. For example, dual sided SiP 300 may fit at least twice as many components, as a compared to a single sided SiP, because a size of an area available for components in dual sided SiP 300 may be at least twice as large as a size of an area available for components in the single sided SiP. Dual sided SiP 300 may also enable more components to be provided in PCB 210 since dual sided SiP 300 may increase an area of use of PCB 210 to two or more modules per unit of area of PCB 210.

In one example implementation, dual sided SiP 300 may include some or most (e.g., all) of the components of PCB 210 that perform functions that require high speed signaling. Dual sided SiP 300 may route the high speed signals between the components within dual sided SiP 300. As a result, PCB 210 may need to accommodate fewer (if any) high speed signals (outside of dual sided SiP 300) and a routing density of PCB 210 may also decrease.

Figure 4:
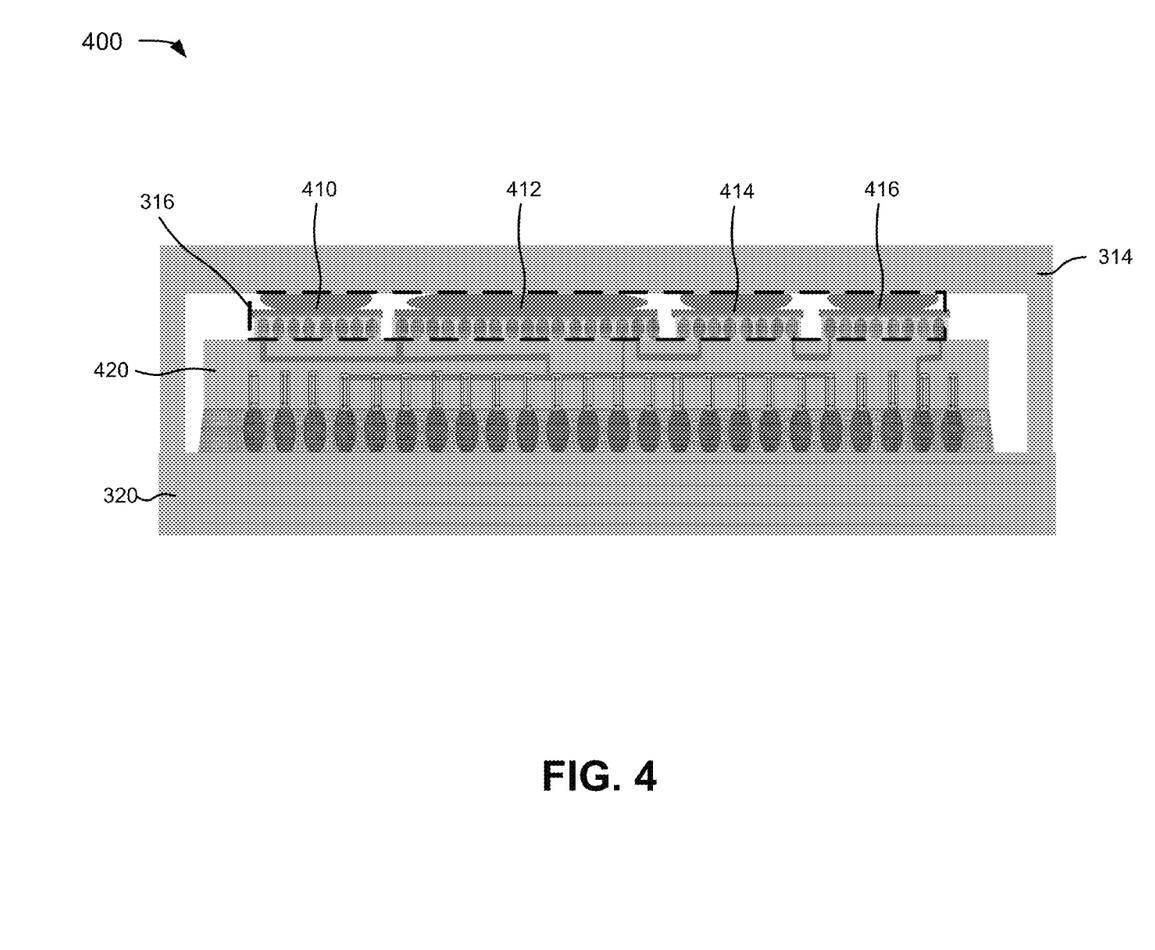
FIG. 4 is a diagram of example components included in a section of one side of a dual sided SiP.

FIG. 4 is a diagram of example components included in a section 400 of one portion (e.g., first portion 310) of dual sided SiP 300. As shown in FIG. 4, section 400 may include lid 314, package substrate 320, a plurality of ICs 410-416 (e.g., first set of ICs 316), and a space transformer 420. In practice, section 400 may include more components, fewer components, different components, and/or differently arranged components. For example, section 400 may include one or more other ICs. In another example, section 400 may not include space transformer 420. Lid 314 may surround ICs 410-416 and space transformer 420. Section 400 may connect to PCB 210 via package substrate 320. Lid 314, package substrate 320, and first set of ICs 316 may include the features described above in connection with, for example, FIG. 3.

In one example, each of ICs 410-416 may include one or more different types of ICs. For example, IC 410 may include a central processing unit (CPU) and/or another type of processing unit (e.g., a specially designed Ethernet network processor for networking devices). IC 412 may include an application-specific integrated circuit (ASIC) and/or any type of IC switch. IC 414 and/or IC 416 may include one or more types of different types of memories (e.g., a reduced-latency dynamic random access memory (RLDRAM), a double data rate synchronous dynamic random access memory (DDR2 SDRAM), etc.). In another example, each of ICs 410-416 may include the same type of IC.

ICs 410-416 may transmit signals to one another via space transformer 420 and/or via package substrate 320. ICs 410-416 may also transmit signals to, and receive signals from, components (e.g., ICs) of second portion 330 (FIG. 3) via space transformer 420 and/or via package substrate 320. Space transformer 420 and/or package substrate 320 may provide connections between one or more of ICs 410-416 and/or the components (e.g., ICs) of second portion 330. Space transformer 420 and/or package substrate 320 may allow faster transmission of signals than transmission of signals via PCB 210. The transmission of signals within dual sided SiP 300 may greatly increase power efficiency (i.e., may reduce power consumption) as compared to when the signals are transmitted via PCB 210. The reduced power consumption may decrease an amount of heat generated in device 110.

Space transformer 420 may include multiple layers that allow a vertical electrical connection to pass through. Space transformers 420 may be composed of silicon substrate and multiple interconnecting layers. The interconnecting layers may include conductors that are isolated from one another with dielectric material (e.g., a silicon copper/bis-benzocyclobutene (BCB) material, a low K dielectric interposer material, etc.). Through-silicon vias (TSV) may be used to create space transformer 420. Providing space transformer 420 in section 400 may permit an increased quantity of signals to be transmitted between ICs of dual sided SiP 300 and, in turn, may permit an increased quantity of ICs to be provided in section 400 and in dual sided SiP 300.

In another implementation, section 400 may include one or more other types of intermediary layers provided between ICs 410-416 and package substrate 320 instead of or in addition to space transformer 420. In yet another implementations, section 400 may also include an array of balls (e.g., solder balls), pins, and/or one or more other types of interconnections that connect ICs 410-416, space transformer 420, and/or one or more of the other types of intermediary layers to package substrate 320.

Figure 5:
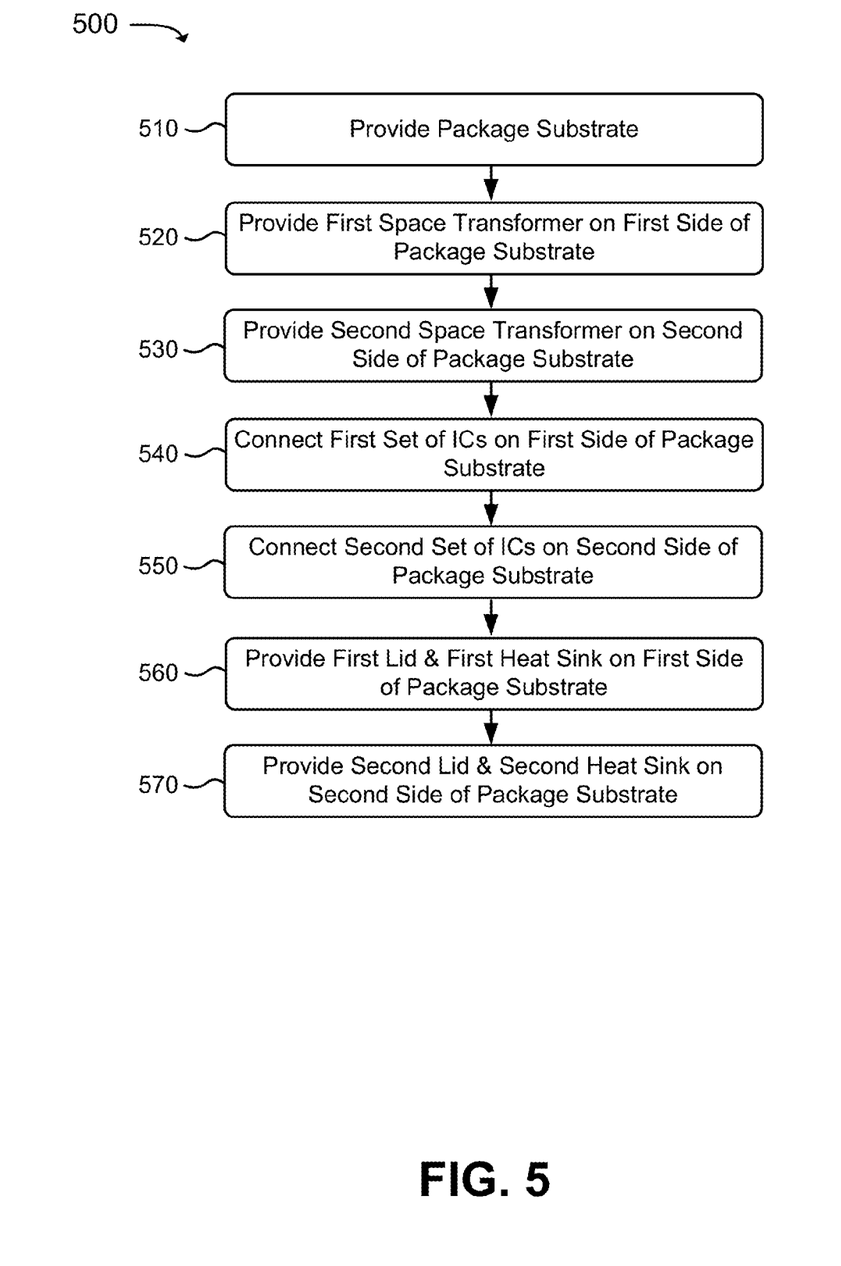
FIG. 5 is a flowchart of an example process for creating a dual sided SiP.

FIG. 5 is a flowchart of an example process 500 for creating a dual sided SiP (e.g., dual sided SiP 300). In one implementation, a designer may use software to create a design for dual sided SiP 300. A manufacturing device (e.g., one or more computing devices, robotics, PCB manufacturing devices, etc. with processors) may perform process 500 based on the design.

As shown in FIG. 5, process 500 may include providing a package substrate (block 510), providing a first space transformer on a first side of the package substrate (block 520), and providing a second space transformer on a second side of the package substrate (block 530). For example, as shown in FIG. 3, package substrate 320 may be provided for dual sided SiP 300. Through-silicon vias (TSV) may be used to create space transformer 420 and a, different, second space transformer. As shown in FIG. 4, space transformer 420 may be provided on a first side of package substrate 320. Providing space transformer 420 may include attaching space transformer 420 to, for example, a top side of package substrate 320. The second space transformer may be provided on a second side of package substrate 320. Providing the second space transformer may include attaching the second space transformer to, for example, a bottom side of package substrate 320.

Process 500 may further include connecting a first set of ICs on the first side of the package substrate (block 540) and connecting a second set of ICs on the second side of the package substrate (block 550). For example, as shown in FIGS. 3 and 4, first set of ICs 316 may be provided on a first side of package substrate 320, on top of space transformer 420. Second set of ICs 336 may be provided on a second side of package substrate 320, on top of the second space transformer. Providing first set of ICs 316 may include attaching one or more ICs 412-416, individually, to space transformer 420. Providing second set of ICs 336 may include attaching one or more ICs, individually, to the second space transformer. ICs 412-416 and the IC(s) in second set of ICs 336 may be connected, via space transformer 420, package substrate 320, and the second space transformer, to one another. A quantity of ICs 412-416 in first set of ICs 316 may be different from a quantity of the ICs in second set ICs.

Process 500 may also include providing a first lid and a first heat sink on the first side of the package substrate (block 560). For example, as shown in FIG. 3, first lid 314 and first heat sink 312 may be provided in first portion 310 (e.g., on the first side of package substrate 320). Providing first lid 314 may include attaching first lid 314 to package substrate 320 in order for first lid 314 to enclose space transformer 420 and first set of ICs 316. Providing first heat sink 312 may include attaching first heat sink 312 to a top of first lid 314.

Process 500 may also include providing a second lid and a second heat sink on the second side of the package substrate (block 570). For example, second lid 334 and second heat sink 332 may be provided in second portion 330 (e.g., on the second side of package substrate 320). Providing second lid 334 may include attaching second lid 334 to package substrate 320 in order for second lid 334 to enclose the second space transformer and second set of ICs 336. Providing second heat sink 332 may include attaching second heat sink 332 to a top of second lid 334.

Figure 6:
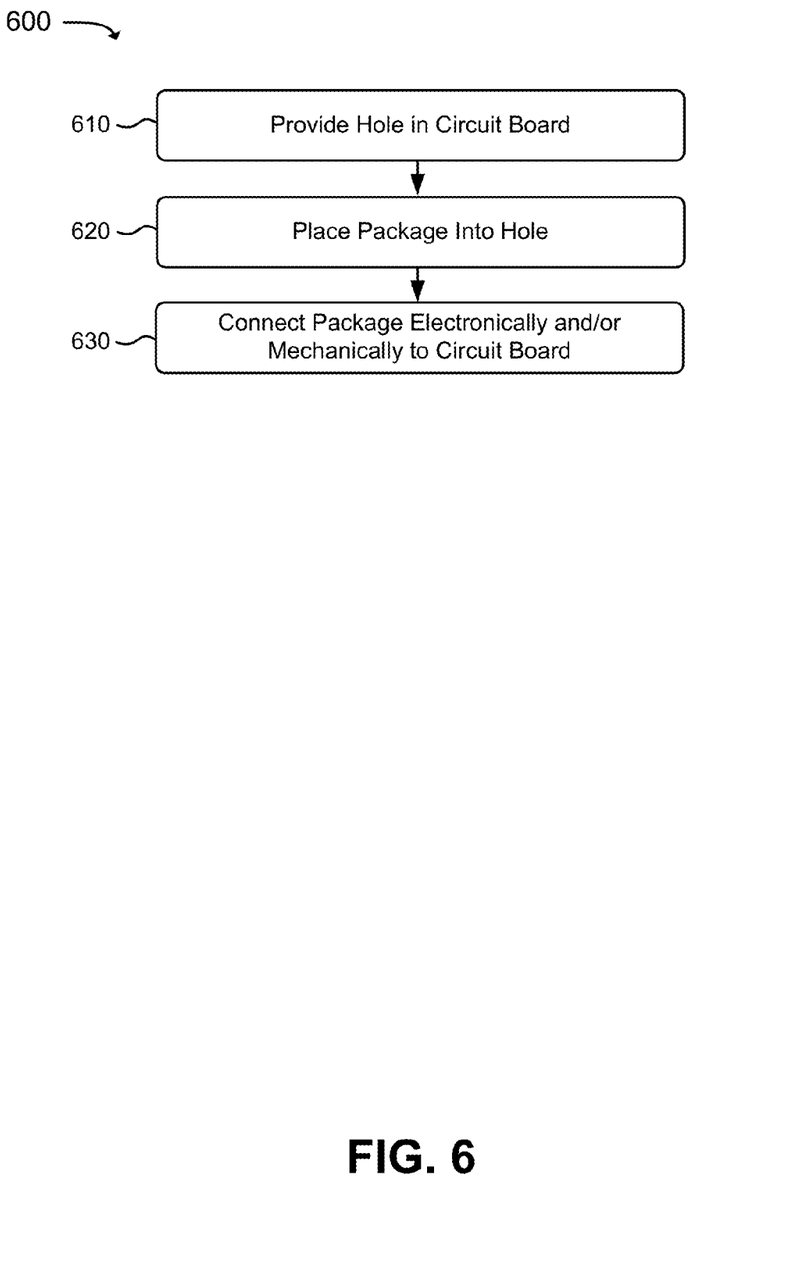
FIG. 6 is a flowchart of an example process for connecting a dual sided SiP to a circuit board.

FIG. 6 is a flowchart of an example process 600 for connecting a dual sided SiP to a circuit board. In one implementation, a designer may use software to a design dual sided SiP 300 and/or PCB 210 for dual sided SiP 300. A manufacturing device (e.g., one or more computing devices, robotics, PCB manufacturing devices, etc. with processors) may perform process 600 based on the design.

As shown in FIG. 6, process 600 may include providing a hole in a circuit board (block 610). For example, hole 250 may be provided in PCB 210. Providing hole 250 may include creating PCB 210 with hole 250, for dual sided SiP 300, and/or one or more other holes for different SiPs.

Process 600 may further include placing a package into the hole (block 620). For example, as shown in FIG. 3, dual sided SiP 300 may be placed into hole 250. Placing dual sided SiP 300 into hole 250 may include positioning SiP 300 so that first portion 310 is on one side (e.g., a top side) of PCB 210 and second portion 330 is on another, opposite side (e.g., a bottom side) of PCB 210.

Process 600 may also include connecting the package electronically and/or mechanically to the circuit board (block 630). For example, as shown in FIG. 3, a portion of package substrate 320 that extends beyond first lid 314 and second lid 334 may be electronically and/or mechanically connected to one or both sides of PCB 210.

The foregoing description of implementations provides illustration and description, but is not intended to be exhaustive or to limit the implementations to the precise form disclosed. Modifications and variations are possible in light of the above teachings or may be acquired from practice of these implementations.

For example, while series of blocks have been described with regard to FIGS. 5 and 6, the order of the blocks may be modified in other implementations. Further, non-dependent blocks may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code-it being understood that software and control hardware could be designed to implement the aspects based on the description herein.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A dual sided package comprising:
   a first portion that includes a first set of integrated circuits (ICs),
       the first set of ICs including one or more ICs that face a first direction;
   a second portion that includes a second set of ICs,
       the second set of ICs including one or more ICs that face a second direction, and
       the second direction being an opposite direction of the first direction; and
   a package substrate provided between the first portion and the second portion,
       the first portion further including a first space transformer provided between the first set of ICs and the package substrate.

2. The dual sided package of claim 1, where the first portion further includes:
   a first heat sink that radiates heat away from the dual sided package, and
   a first lid, and
   where the first set of ICs is inside the first lid.

3. The dual sided package of claim 2, where the second portion further includes:
   a second heat sink that radiates heat away from the dual sided package, and
   a second lid, and
   where the second set of ICs is inside the second lid.

4. The dual sided package of claim 1, where the second portion further includes a second space transformer provided between the second set of ICs and the package substrate.

5. The dual sided package of claim 1, where the package substrate includes an organic core ball grid array (BGA) substrate.

6. The dual sided package of claim 1, where a first material of the package substrate is substantially same as a second material of a printed circuit board (PCB) connected to the dual sided package.

7. A device comprising:
   a circuit board that includes an opening; and
   a dual sided package provided in the opening and connected to the circuit board, the dual sided package including:
       a first portion with a first set of integrated circuits (ICs),
       a second portion with a second set of ICs, and
       a package substrate provided between the first portion and the second portion,
   the dual sided package routing high speed signals between the first set of ICs and the second set of ICs,
   the package substrate connecting to the circuit board, and
   the first portion and the second portion facing opposite directions.

8. The device of claim 7, where a first coefficient of thermal expansion (CTE) of the package substrate matches a second CTE of the circuit board.

9. The device of claim 7,
   where the first portion further includes a first heat sink that radiates heat away from the dual sided package, and
   where the second portion further includes a second heat sink that radiates the heat away from the dual sided package.

10. The device of claim 9, where the first heat sink and the second heat sink radiate the heat away via convection or radiative cooling.

11. The device of claim 7,
   where the first portion further includes a first lid to dissipate heat, and
   where the second portion further includes a second lid to dissipate heat.

12. The device of claim 7,
   where the first portion further includes a first space transformer provided between the first set of ICs and the package substrate, and
   where the second portion further includes a second space transformer provided between the second set of ICs and the package substrate.

13. The device of claim 12, where the first space transformer and the second space transformer include at least one of:
   a dielectric, or
   conductors.

14. A method comprising:
   providing a package substrate for a dual sided package;
   providing a first space transformer on a first side of the package substrate;
   connecting a first set of integrated circuits (ICs) on the first side of the package substrate,
       the first set of ICs including one or more ICs that face a first direction;
   providing a second space transformer on a second side of the package substrate; and
   connecting a second set of ICs on the second side of the package substrate,
       the second set of ICs including one or more ICs that face a second direction, and
       the second direction being an opposite direction of the first direction.

15. The method of claim 14, further comprising:
   providing an opening in a circuit board associated with the dual sided package;
   providing the dual sided package in the opening; and
   connecting the package substrate to the circuit board.

16. The method of claim 14, further comprising:
   providing at least one of a first lid or a first heat sink on the first side of the package substrate after connecting the first set of ICs; and
   providing at least one of a second lid or a second heat sink on the second side of the package substrate after connecting the second set of ICs.

17. The method of claim 14, where a first quantity of ICs in the first set of ICs is different from a second quantity of ICs in the second set ICs.

18. The method of claim 14, where the package substrate includes an organic core ball grid array (BGA) substrate.

19. The method of claim 14, where a first coefficient of thermal expansion (CTE) of the package substrate matches a second CTE of a circuit board associated with the dual sided package.

20. The method of claim 14, where a first material of the package substrate is substantially same as a second material of a printed circuit board (PCB) connected to the dual sided package.

\* \* \* \* \*